United States Patent
Redaelli et al.

(10) Patent No.: US 11,404,479 B2
(45) Date of Patent: *Aug. 2, 2022

(54) MEMORY INCLUDING A SELECTOR SWITCH ON A VARIABLE RESISTANCE MEMORY CELL

(71) Applicant: Micron Technology, Inc., Boise, ID (US)

(72) Inventors: Andrea Redaelli, Casatenovo (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/122,684

(22) Filed: Dec. 15, 2020

(65) Prior Publication Data

US 2021/0210552 A1 Jul. 8, 2021

Related U.S. Application Data

(60) Continuation of application No. 16/440,596, filed on Jun. 13, 2019, now Pat. No. 10,896,930, which is a (Continued)

(30) Foreign Application Priority Data

Nov. 30, 2009 (WO) .................. PCT/IT2009/000537

(51) Int. Cl.
*H01L 27/24* (2006.01)
*G11C 13/00* (2006.01)
(Continued)

(52) U.S. Cl.
CPC .......... *H01L 27/2409* (2013.01); *G11C 13/00* (2013.01); *G11C 13/0004* (2013.01);
(Continued)

(58) Field of Classification Search
CPC . H01L 27/2409; H01L 27/2481; H01L 45/06; H01L 45/1233; H01L 45/1273;
(Continued)

(56) References Cited

U.S. PATENT DOCUMENTS 6,266,731 B1  7/2001  Riley et al.
6,426,891 B1  7/2002  Katori
(Continued)

FOREIGN PATENT DOCUMENTS

CN          101231970 A       7/2008

OTHER PUBLICATIONS

Godlewski, et al., "Vertically stacked non-volatile memory devices—material considerations," Microelectronic Engineering, Sep. 21, 2008, 5 pgs., vol. 85, No. 12, 2008 Elsevier Publishers BV., Amsterdam, NL.

(Continued)

*Primary Examiner* — James G Norman
(74) *Attorney, Agent, or Firm* — Holland & Hart LLP

(57) ABSTRACT

Embodiments include but are not limited to apparatuses and systems including memory having a memory cell including a variable resistance memory layer, and a selector switch in direct contact with the memory cell, and configured to facilitate access to the memory cell. Other embodiments may be described and claimed.

13 Claims, 6 Drawing Sheets

Related U.S. Application Data continuation of application No. 15/918,770, filed on Mar. 12, 2018, now Pat. No. 10,374,007, which is a division of application No. 15/297,925, filed on Oct. 19, 2016, now Pat. No. 9,947,719, which is a continuation of application No. 14/947,455, filed on Nov. 20, 2015, now Pat. No. 9,502,650, which is a continuation of application No. 12/957,286, filed on Nov. 30, 2010, now Pat. No. 9,196,355.

(51) Int. Cl.
  *H01L 45/00* (2006.01)
  *H01L 27/28* (2006.01)

(52) U.S. Cl.
  CPC ...... *G11C 13/0014* (2013.01); *G11C 13/0016* (2013.01); *H01L 27/2481* (2013.01); *H01L 45/06* (2013.01); *H01L 45/1233* (2013.01); *H01L 45/1273* (2013.01); *H01L 45/14* (2013.01); *H01L 45/141* (2013.01); *H01L 45/144* (2013.01); *H01L 45/146* (2013.01); *H01L 45/1608* (2013.01); *G11C 2213/72* (2013.01); *H01L 27/285* (2013.01)

(58) Field of Classification Search
  CPC ..... H01L 45/14; H01L 45/141; H01L 45/144; H01L 45/146; H01L 45/1608; H01L 27/285; G11C 13/00; G11C 13/0004; G11C 13/0014; G11C 13/0016; G11C 2213/72
  See application file for complete search history.

(56) References Cited

U.S. PATENT DOCUMENTS

| | | | |
|---|---|---|---|
| 6,657,884 | B2 | 12/2003 | Bocian et al. |
| 6,858,481 | B2 | 2/2005 | Krieger et al. |
| 6,990,017 | B1 | 1/2006 | Parkinson et al. |
| 7,397,689 | B2 | 7/2008 | Liu et al. |
| 7,446,391 | B2 | 11/2008 | Odagawa et al. |
| 7,746,683 | B2 | 6/2010 | Hoffmann et al. |
| 8,027,215 | B2 | 9/2011 | Lambertson et al. |
| 8,178,875 | B2 | 5/2012 | Kiyotoshi |
| 2007/0015348 | A1 | 1/2007 | Hsu et al. |
| 2007/0020797 | A1* | 1/2007 | Pellizzer ................ H01L 45/06 438/95 |
| 2010/0157710 | A1 | 6/2010 | Lambertson et al. |
| 2010/0213433 | A1 | 8/2010 | Yamamoto et al. |
| 2010/0233836 | A1 | 9/2010 | Kyotani et al. |
| 2010/0321979 | A1 | 12/2010 | Yasutake et al. |

OTHER PUBLICATIONS

Huby et al. "New selector based on zinc oxide grown by low temperature atomic layer deposition for vertically stacked non-volatile memory devices", Microelectronic Engineering, Sep. 17, 2008, 3 pgs. vol. 85, 2008 Elsevier Publishers BV., Amsterdam, NL.

ISA/EPO, International Search Report and Written Opinion of the International Searching Authority, Int'l. Appl. No. PCT/IT2009/000537, dated Jun. 2, 2010, European Patent Office, Rijswijk, NL, 12 pgs.

Lee, M.J., et al., "A low-temperature-grown oxide diode as a new switch element for high-density, nonvolatile memories," Advanced Materials, Dec. 12, 2016, pp. 73-76, vol. 19, No. 1, 2007 WILEY-VCH Verlag GmbH & Co. KGaA, Weinheim.

* cited by examiner

MEMORY INCLUDING A SELECTOR SWITCH ON A VARIABLE RESISTANCE MEMORY CELL

CROSS-REFERENCES

The present application for patent is a continuation of U.S. patent application Ser. No. 16/440,596 by Redaelli et al., entitled "Memory Including a Selector Switch on a Variable Resistance Memory Cell," filed Jun. 13, 2019, which is a continuation of U.S. patent application Ser. No. 15/918,770 by Redaelli et al., entitled "Memory Including a Selector Switch on a Variable Resistance Memory Cell," filed Mar. 12, 2018, which is a divisional of U.S. patent application Ser. No. 15/297,925 by Redaelli et al., entitled "Memory Including a Selector Switch on a Variable Resistance Memory Cell," filed Oct. 19, 2016, which is a continuation of U.S. patent application Ser. No. 14/947,455 by Redaelli et al., entitled "Memory Including a Selector Switch on a Variable Resistance Memory Cell," filed Nov. 20, 2015, which is a continuation of U.S. patent application Ser. No. 12/957,286 by Redaelli et al., entitled "Memory Including a Selector Switch on a Variable Resistance Memory Cell," filed Nov. 30, 2010, which claims priority to International Application No. PCT/IT2009/000537 by Redaelli et al., entitled "Memory Including a Selector Switch on a Variable Resistance Memory Cell," filed Nov. 30, 2009, assigned to the assignee hereof, and each of which is expressly incorporated by reference in its entirety herein.

BACKGROUND

Memory devices including variable resistance memory cells may represent a low-cost alternative for future high-density memories. Variable resistance memory cells such as organic-based memory and phase change memory sometimes may be implemented in crossbar architectures, wherein more than one memory array is integrated in a three-dimensional stacked memory chip.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
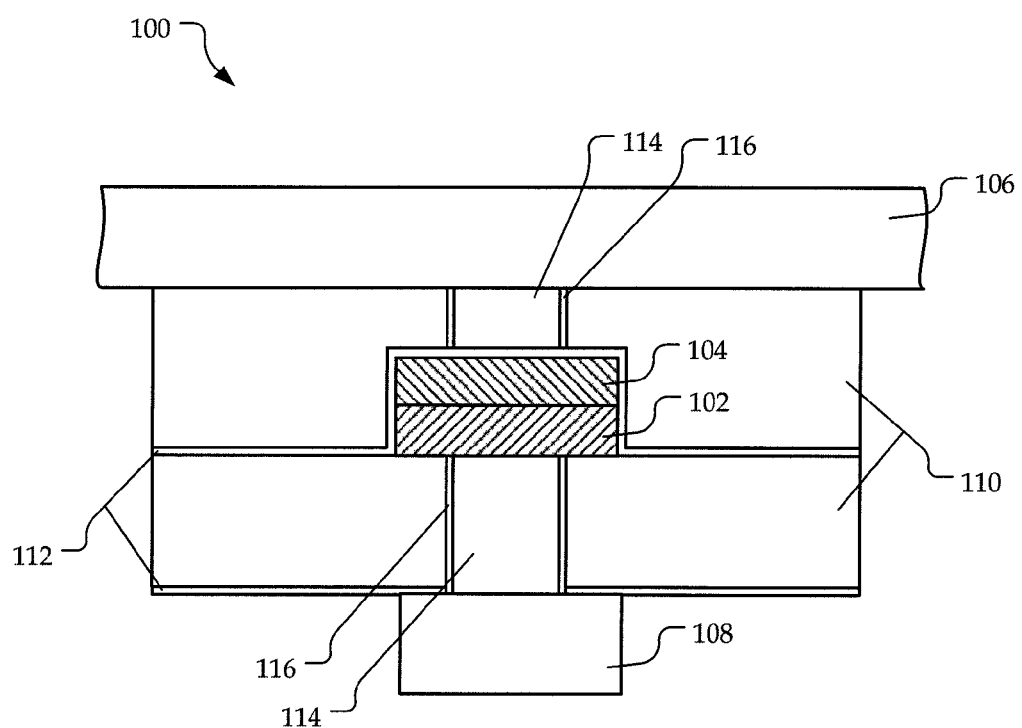
FIG. 1 illustrates an example apparatus comprising a memory cell including a variable resistance memory layer, and a selector switch in direct contact with the memory cell.

all arranged in accordance with various embodiments of the present disclosure.

DETAILED DESCRIPTION OF THE EMBODIMENTS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to memory having a memory cell including a variable resistance memory layer, and a selector switch in direct contact with the memory cell, and configured to facilitate access to the memory cell. Embodiments include, but are not limited to, methods, apparatuses, and systems. Other embodiments may also be disclosed and claimed.

The present disclosure recognizes that variable resistance memory cells such as molecular memory and phase change memory sometimes tend to have lower thermal thresholds relative to traditional three-terminal transistor-based memory cells. For instance, in some cases, exposure to temperatures over 200-300° C. may have a detrimental impact on the functionality of variable resistance memory cells. The present disclosure further recognizes that silicon-based selectors for decoding these memory arrays may be incompatible with variable resistance memory cells at least for embodiments in which variable resistance memory cells are implemented in crossbar architectures, wherein more than one memory array is integrated in a three-dimensional stacked memory chip. This incompatibility may be due at least in part to the fabrication temperature of silicon-based selectors commonly being higher than the thermal threshold of various types of variable resistance memory.

The present disclosure is drawn to a memory cell including a variable resistance memory layer, and a selector switch in direct contact with the memory cell. In various embodiments in accordance with the present disclosure, the selector switch may be realized with a total thermal budget that is compatible with the characteristics of the variable resistance memory layer. At least in some embodiments, for instance, the selector switch may be realized with a total thermal budget of less than 150° C.

FIG. 1 illustrates an example apparatus 100 comprising a memory cell 102, and a selector switch 104 configured to facilitate access to the memory cell 102, arranged in accordance with at least some embodiments of the present disclosure. The memory cell 102 may comprise at least one layer of variable resistance memory material, and the selector switch 104 may be in direct contact with the memory cell 102 as illustrated. In various embodiments, the selector switch 104 may comprise a Schottky diode.

The variable resistance memory material of the memory cells 102 may comprise any variable resistance material suitable for the application. In various embodiments, the memory cell 102 comprising such variable resistance memory material may effectively function as programmable resistors, whose resistance is variable based at least in part on a voltage applied (e.g., by a bit line and a word line) between the terminals of the memory cell 102.

In various embodiments, the variable resistance memory material may comprise an organic switch material. Example organic switch material may include a self assembled monolayer, an organic-metal-organic complex, or bulk organic semiconductor realized with single molecules, oligomers, or polymers. Example organic switch material may include a polymer such as porphyrin polymer, polyacetylene, polypyridine, poly styrene, polyaniline, polythiphene; polypyrrole, polysilane, or the like. In various embodiments, the organic switch material may include a conductive material such as silver or copper dispersed therein.

In various embodiments, the variable resistance memory material may comprise a phase change material. A phase change material may include a chalcogenide comprising an alloy containing a group VI element (e.g., oxygen, sulfur, selenium, tellurium, etc.), also known as chalcogens, combined with a group IV/V element (e.g., germanium, tin, arsenic, antimony, etc.). An example chalcogenide may include $Ge_2Sb_2Te_5$ (GST).

Other variable resistance memory material may be similarly suitable. Resistive random access memory, for example, may enlist a transition metal oxide or other suitable variable resistance material.

In various embodiments, the apparatus 100 may be a memory device comprising a memory array including the memory cell 102 and a plurality of other similarly configured memory cells. In various ones of these embodiments, the memory cell 102 may be coupled to one or more other similarly configured memory cells by a word line 106 and a bit line 108, as discussed more fully herein. The apparatus 100 may include various other elements for forming the memory device including, for example, one or more dielectric layers 110, one or more sealing layers 112, and/or one or more conductive plugs 114. The one or more conductive plugs 114 may be configured to allow electrical access to the memory cell 102 by way of the selector switch 104, and so, may comprise a conductive material such as tungsten or the like. The one or more conductive plugs 114 may include a diffusion barrier layer 116 formed between the one or more conductive plugs 114 and various surrounding elements such as the dielectric layer 110.

Figure 2:
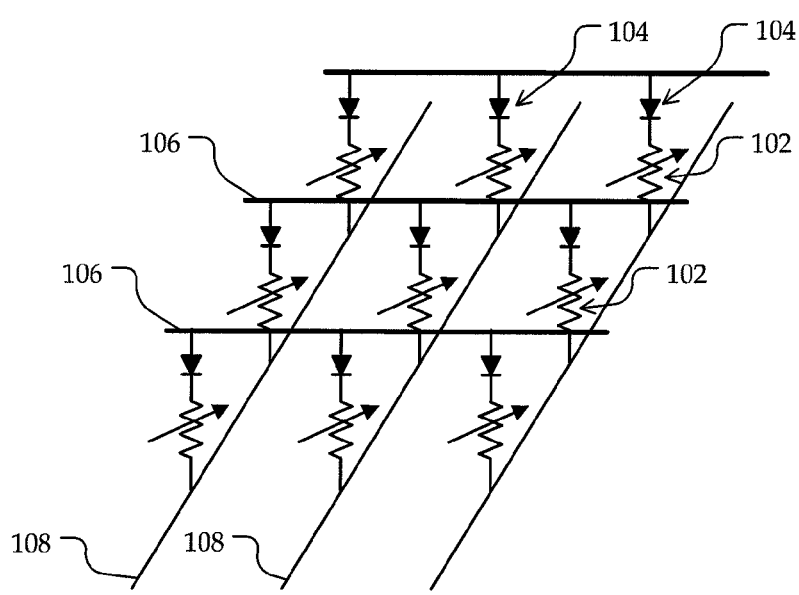
FIGS. 2 and 3 are schematic representations of a portion of an example memory array architecture including memory cells including a variable resistance memory layer, and a selector switch in direct contact with the memory cell.
Figure 3:
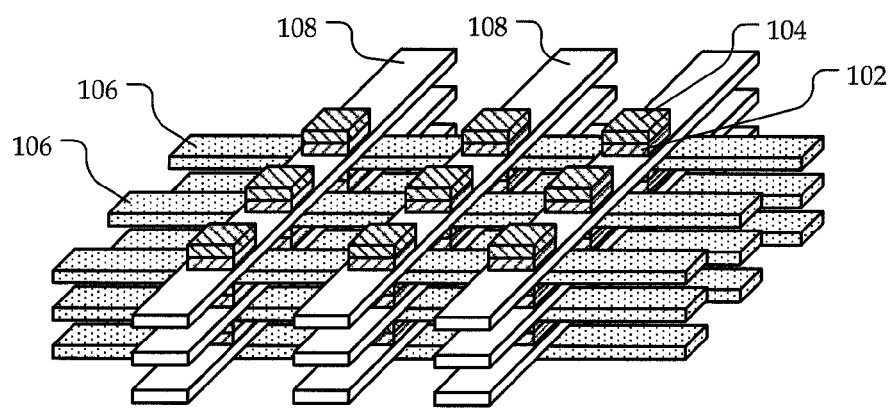

FIGS. 2 and 3 are schematic representations of a portion of an example memory array architecture including memory cells 102 including a variable resistance memory layer, and a selector switch 104 in direct contact with the memory cell 102, arranged in accordance with at least some embodiments of the present disclosure. As illustrated, the architecture may include a plurality of word lines 106 and a plurality of bit lines 108. The plurality of memory cells 102 may be arranged in an array of a plurality of columns and a plurality of rows. Each memory cell 102 in a column may be coupled to each other by a corresponding bit line 108, and each memory cell 102 in a row may be coupled to each other by a corresponding word line 106.

As illustrated, a selector switch 104 may be provided in direct contact with each of the plurality of memory cells 102. In various embodiments, the plurality memory cells 102 and selector switches 104 may be successively stacked to form a three-dimensional crossbar memory array in which the plurality of memory cells 102 and the selector switches 104 may be located at intersecting junctions of the bit lines 108 and word lines 106. It should be noted that although the illustrated embodiment depicts three layers of memory cells 102, memory arrays within the scope of the present disclosure may include fewer or more than three layers.

Figure 4:
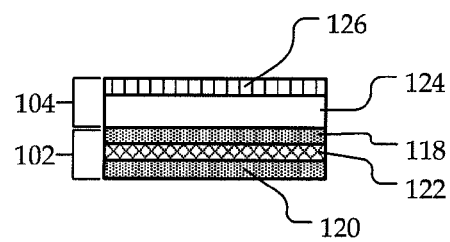
FIG. 4 illustrates an example memory cell including a variable resistance memory layer, and a selector switch in direct contact with the memory cell.
Figure 5:
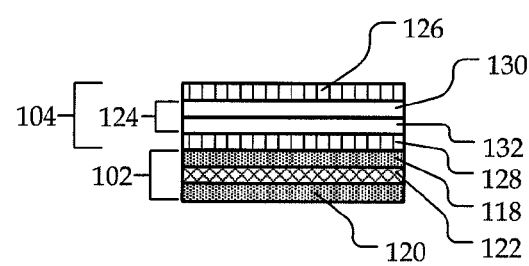
FIG. 5 illustrates another example memory cell including a variable resistance memory layer, and a selector switch in direct contact with the memory cell.
Figure 6:
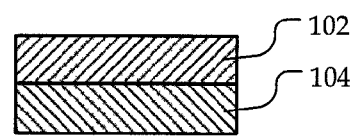
FIG. 6 illustrates an example memory cell including a variable resistance memory layer, and a selector switch in direct contact with the memory cell.

FIGS. 4-6 illustrate various examples of the memory cell 102 and selector switch 104, arranged in accordance with at least some embodiments of the present disclosure.

The memory cell 102 may include any one or more layers suitable for forming a memory cell. In various embodiments, the memory cell 102 may include a top electrode layer 118 and a bottom electrode layer 120, with the variable resistance memory layer 122 disposed between the top electrode layer 118 and the bottom electrode layer 120. In various ones of these embodiments, the selector switch 104 may be in direct contact with the top electrode layer 118 of the memory cell 102.

The top electrode layer 118 and the bottom electrode layer 120 may comprise any suitable conductive material. Example suitable conductive materials may include aluminum, titanium, carbon, nickel, gold, silver, platinum, or a combination of one or more thereof. Other conductive materials may be similarly suitable.

As noted herein, the selector switch 104 may be a Schottky diode. Accordingly, various embodiments of the selector switch 104 may be configured in a manner suitable for realizing a Schottky diode structure including a semiconductor-metal junction. In various embodiments, and as illustrated in FIG. 4, the selector switch 104 may include a non-silicon-based semiconductor layer 124 and a metal layer 126. The semiconductor layer 124 may comprise any suitable non-silicon-based semiconductor including, for one or more doped layers. In various embodiments, the non-silicon-based semiconductor layer 124 may comprise n-type doped zinc oxide.

The metal layer 126 may similarly comprise any suitable material for forming the Schottky diode structure in conjunction with the selected non-silicon-based semiconductor layer 124. In various embodiments, for example, the metal layer 126 may comprise silver. Other metals may be similarly suitable, including, for example, aluminum, platinum, silver, carbon, titanium, nickel, or gold, or combinations thereof.

The selector switch 104 may include one or more additional non-silicon-based semiconductor layers 124. As illustrated in FIG. 5, for example, the non-silicon-based semiconductor layers 124 may comprise two non-silicon-based semiconductor layers 130, 132. The non-silicon-based semiconductor layers 130, 132 may comprise any suitable combination of materials for forming the Schottky diode structure. In various embodiments, for example, one of the non-silicon-based semiconductor layers 130, 132 may comprise n-type doped zinc oxide, while the other one of the non-silicon-based semiconductor layers 130, 132 may comprise p-type doped zinc oxide.

The selector switch 104 may include one or more additional non-silicon-based semiconductor layers 124 and/or one or more additional metal layers 126. As illustrated in FIG. 5, for example, the selector switch 104 may include another metal layer 128. The other metal layer 128 may comprise the same or different metal than that of the metal layer 126. In some embodiments, for example, the metal layer 126 comprises silver, while the metal layer 128 comprises a titanium/gold alloy.

In various embodiments, the memory cell 102 and the selector switch 104 may be reversed relative to the embodiment illustrated in FIG. 1. As illustrated in FIG. 6, for example, the memory cell 102 may be formed on the selector switch 104.

Figure 7:
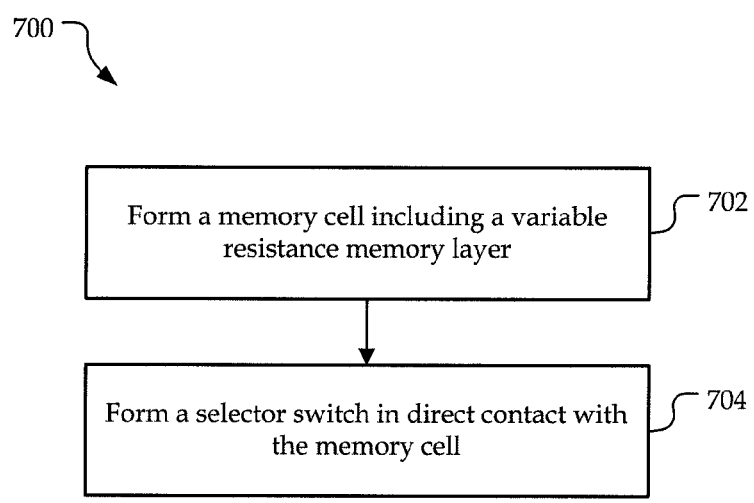
FIG. 7 is a flow diagram illustrating some of the operations associated with an example method of making an apparatus comprising a memory cell including a variable resistance memory layer, and a selector switch in direct contact with the memory cell.

The apparatuses of FIGS. 1-6 may be more clearly understood with reference to FIG. 7. FIG. 7 is a flow diagram illustrating some of the operations associated with an example method of making an apparatus comprising a memory cell including a variable resistance memory layer, and a selector switch in direct contact with the memory cell, arranged in accordance with at least some embodiments of the present disclosure. It should be noted that although the method is illustrated as a series of sequential steps, the method is not necessarily order dependent. Moreover, methods within the scope of this disclosure may include more or fewer steps than that illustrated.

Turning now to FIG. 7, with continued reference to various elements of the apparatuses of FIGS. 1-6, the method 700 may include one or more functions, operations, or actions as is illustrated by block 702 and/or block 704. Processing for the method 700 may start with block 702, "Form a memory cell including a variable resistance memory layer." Forming the memory cell may include forming a bottom electrode layer, the variable resistance memory layer on the bottom electrode layer, and a top electrode layer on the variable resistance layer. The variable resistance memory layer may comprise a molecular switch material or a phase change material.

In various embodiments, forming the memory cell may include forming a plurality of memory cells arranged in an array of a plurality of columns and a plurality of rows, and forming a plurality of bit lines and a plurality of word lines, wherein each memory cell in a column is coupled to each other by a corresponding bit line, and wherein each memory cell in a row is coupled to each other by a corresponding word line.

From block 702, the method 700 may proceed to block 704, "Form a selector switch in direct contact with the memory cell." Forming the selector switch may include forming the selector switch with a total thermal budget of less than 150° C.

Figure 8:
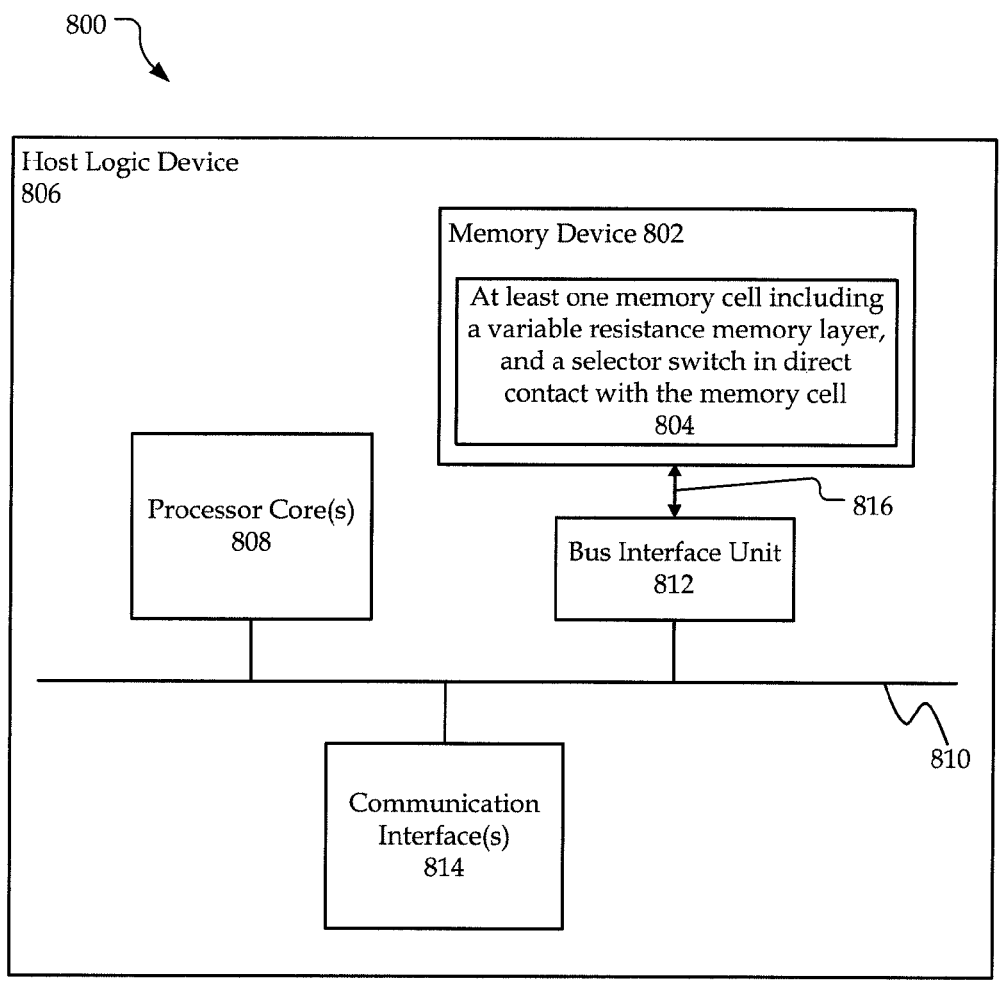
FIG. 8 is a block diagram of an example system including an apparatus comprising a memory cell including a variable resistance memory layer, and a selector switch in direct contact with the memory cell.

Embodiments of apparatuses described herein may be incorporated into various other apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an example system 800 is illustrated in FIG. 8. As illustrated, the system 800 may include a memory device 802. In various embodiments, memory device 802 may be a volatile or a non-volatile memory device. In various embodiments, memory device 802 may be a NAND, NOR, or phase change non-volatile flash memory device. In various embodiments, the memory device 802 may at least one memory cell including a variable resistance memory layer, and a selector switch in direct contact with the memory cell, collectively 804. The selector switch may be configured to selectively couple the at least one memory cell to an output terminal 816 of the memory device 802.

In various embodiments, memory device 802 may be operatively coupled to a host logic device 806. In various embodiments, the host logic device 806 may be mounted to the same substrate memory device 802 is mounted. In other embodiments, memory device 802 may be joined with host logic device 806. In various embodiments, the host logic device 806 may be a microcontroller, a digital signal processor or a general purpose microprocessor. In various embodiments, host logic device 806 may include a processor core 808, or a plurality of processor cores 808.

In various embodiments, the system 800 may further comprise a host logic device bus 810 operatively coupling the memory device 802 and the host logic device bus 810, including electrically coupling memory device 802 and the host logic device 806. In various embodiments, host logic device bus 810 may be disposed on a substrate to which both memory 802 and host logic device 806 are mounted.

In various embodiments, the system 800 may further include communications interface(s) 814 to provide an interface for system 800 to communicate over one or more networks and/or with any other suitable device. Communications interface(s) 814 may include any suitable hardware and/or firmware. Communications interface(s) 814 for one embodiment may include, for example, a network adapter, a wireless network adapter, a telephone modem, and/or a wireless modem. For wireless communications, communications interface(s) 814 for one embodiment may use one or more antennas (not illustrated).

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g. the bare recitation of "two recitations," without other modifiers typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Various operations may be described as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   forming a sealing material on at least a sidewall of a selector switch and on at least a sidewall of a memory cell; and
   forming a conductive plug in contact with and disposed on at least a portion of the sealing material.

2. The method of claim 1, further comprising:
   forming the selector switch in contact with a portion of the memory cell.

3. The method of claim 2, wherein forming the selector switch further comprises:
   forming a first metal material; and
   forming a first non-silicon-based semiconductor material in contact with an upper surface of the first metal material.

4. The method of claim 3, wherein forming the selector switch further comprises:
   forming a second metal material; and
   forming a second non-silicon-based semiconductor material disposed between the first non-silicon-based semiconductor material and the second metal material.

5. The method of claim 4, wherein the second non-silicon-based semiconductor material is in contact with the first non-silicon-based semiconductor material and with the second metal material.

6. The method of claim 1, further comprising:
   forming an upper electrode material and a lower electrode material; and
   forming a variable resistance memory material disposed between the upper electrode material and the lower electrode material.

7. The method of claim 1, further comprising:
   forming a dielectric material in contact with at least a portion of the selector switch, wherein at least a portion of the dielectric material is in contact with at least a portion of the sealing material.

8. A method for forming a memory device, comprising:
   forming a sealing material on a pair of sidewalls of a selector switch and on a pair of sidewalls of a memory cell; and
   forming a conductive plug in contact with and disposed on at least a portion of the sealing material.

9. The method of claim 8, further comprising:
   forming the memory cell on at least a portion of the selector switch.

10. The method of claim 8, wherein the memory cell is in contact with and disposed on the portion of the selector switch.

11. The method of claim 4, wherein the conductive plug is in contact with the sealing material.

12. The method of claim 8, further comprising:
    forming a second conductive plug in contact with the selector switch.

13. The method of claim 12, wherein the conductive plug comprises a first metal material and the second conductive plug comprises a second metal material different from the first metal material.

* * * * *